(12) United States Patent
Cheung et al.

(10) Patent No.: US 7,683,679 B2
(45) Date of Patent: Mar. 23, 2010

(54) AFSM CIRCUIT AND METHOD FOR LOW JITTER PLL CMOS PROGRAMMABLE DIVIDER

(75) Inventors: Hugo Cheung, Tucson, AZ (US); Jatinder Singh, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 11/985,095

(22) Filed: Nov. 14, 2007

(65) Prior Publication Data

US 2009/0122950 A1  May 14, 2009

(51) Int. Cl.
*H03K 21/00* (2006.01)
*H03K 23/00* (2006.01)
*H03K 25/00* (2006.01)

(52) U.S. Cl. ............... 327/115; 327/117; 327/157; 327/158; 377/47

(58) Field of Classification Search ............ 327/115, 327/117, 157; 377/47
See application file for complete search history.

(56) References Cited

U.S. PATENT DOCUMENTS 6,946,884 B2 * 9/2005 Holland et al. ............ 327/115

2007/0152720 A1 * 7/2007 Koh .......................... 327/115

OTHER PUBLICATIONS

"A Fractional-N PLL for Digital Clock Generation With an FIR-Embedded Frequency Divider" by Chi et al., 2007 IEEE, 1-4244-0921-7/07, pp. 3051-3054.
"A CMOS High-Speed Wide-Range Programmable Counter" by Lee et al., 2002 IEEE, 1057-7130/02, pp. 638-642.
"A 2GHz programmable counter with new re-loadable D flip-flop" by Do et al., 2003 IEEE, 0-7803-7749-4/03, pp. 269-272.

* cited by examiner

*Primary Examiner*—Lincoln Donovan
*Assistant Examiner*—John W Poos
(74) *Attorney, Agent, or Firm*—John J. Patti; Wade J. Brady, III; Frederick J. Telecky, Jr.

(57) ABSTRACT

A frequency divider (10A) includes an asynchronous finite state machine (AFSM) configured as a counter (20) having an input coupled to an input clock signal (CLK) for producing information representative of a plurality of phase signals (F0, F1,F2,F3) each of which is a divided-down representation of the input clock signal (CLK) and each of which is phase-shifted by a predetermined amount with respect to another of the phase signals (F0,F1,F2,F3). Programmable circuitry (22) operates in response to both dynamic divide ratio information (DIV_RATIO) and the information representative of the plurality of phase signals (F0,F1,F2,F3) so as to generate an output clock signal (CLKOUT) that is divided down according to both the dynamic divide ratio information and the information representative of the plurality of phase signals (F0,F1,F2,F3).

20 Claims, 5 Drawing Sheets

AFSM CIRCUIT AND METHOD FOR LOW JITTER PLL CMOS PROGRAMMABLE DIVIDER

BACKGROUND OF THE INVENTION

The present invention relates generally to high frequency clock divider circuits, and more particularly to a high frequency clock divider circuit which can be used to divide the voltage controlled oscillator (VCO) output clock and feed the divided output clock back to the phase detector in a phase locked loop (PLL) circuit.

High frequency PLL circuits that operate at frequencies above 1 GHz are widely used in digital radio, communications and multimedia applications and the like. Typical PLL designs include a phase comparator, a PLL clock divider, and a VCO. The PLL clock divider divides the VCO output clock to provide feedback to an input of the phase comparator. Programmable PLL clock dividers having fine frequency steps are needed to maximize the granularity of the PLL output clock frequency steps, i.e., are needed to minimize the difference that can be provided between two consecutive PLL output clock frequency steps.

FIG. 1 shows a conventional PLL including a phase detector 2 which receives a clock input signal REFCLK, and also receives a divided-down clock feedback signal CLK on conductor 13. The output 3 of phase detector 2 is connected to the input of a conventional charge pump circuit 4, the output 5 of which is connected to the input of a conventional voltage controlled oscillator (VCO) 8. The output CLK of VCO 9 is connected to the input of a conventional clock divider 10, the output of which generates the above mentioned divided-down clock signal on conductor 13. Clock divider 10 receives a N-bit input signal which determines the divide ratio DIV_RATIO of clock divider 10. For example, the user may require various divide ratio values in order to select various channels of a digital radio. The divide ratio is generated by a divide ratio generator 11.

The closest prior art is believed to include the technical article "A 2 GHz Programmable Counter with New Re-Loadable D Flip-Flop" by Do, M. A., Yu, X. P., Ma, J. G., Yeo, K. S., Wu, R., Zhang, Q. X. in Electron Devices and Solid-State Circuits, 2003 IEEE Conference on 16-18 Dec. 2003, Pages 269-272 (Digital Object Identifier 10.1109/EDSSC.2003.1283529). This reference discloses a high-speed programmable counter with a new reloadable D Flip-flop which integrates the programmable function to a single true-single-phase-clock (TSPC) D flip-flop. The technical article "A CMOS High-Speed Wide-Range Programmable Counter" by Sang-Hoon Lee and Hong June Park, in Circuits and Systems II: Analog and Digital Signal Processing, IEEE Transactions, Volume 49, Issue 9, September 2002, Page(s): 638-642 (Digital Object Identifier 10.1109/TC-SII.2002.805627), discloses a CMOS high speed wide-range programmable divide-by-N counter. The technical article "A Fractional-N PLL for Digital Clock Generation With an FIR-Embedded Frequency Divider" by Baoyong Chi, Xueyi Yu, Woogeun Rhee and Zhihua Wang in Circuits and Systems, 2007, ISCAS 2007, IEEE International Symposium on 27-30 May 2007, Pages 3051-3054 (Digital Object Identifier 10.1109/ISCAS.2007.378052) discloses an architecture of a fractional-N phase-locked loop for digital clock generation, in which the divide ratio generator is implemented by means of a delta-sigma modulator and the clock divider is implemented by means of shift register circuitry and flip-flops.

Providing a dynamic divide ratio in a clock divider as shown in Prior Art FIG. 1 is known, but requires use of "special" logic circuit designs. For example, the above mentioned article "A 2 GHz Programmable Counter with New Re-Loadable D Flip-Flop" discloses a high-speed programmable counter, but it is not implemented using standard library logic circuit cells. A shortcoming of implementing any of the prior art clock divider designs (such as those disclosed in the foregoing technical articles) using such standard library cells is that the speed limitations of known standard library cells at the current state of the art makes it impossible to achieve reliable division of clock signals having frequencies in excess of roughly 1 GHz. The prior art clock divider designs necessarily use circuits which have been optimized for speed and therefore have not been optimized for use in standard cell integrated circuit layouts or topography.

A problem with the prior art PLL clock divider circuits is that only special logic circuitry that is custom designed and optimized for high frequency operation is capable of accurately dividing the VCO output clock signal at VCO output clock frequencies higher than roughly 1 GHz. Another problem of the prior art clock divider circuits is that it has been difficult to implement them with "fine programming steps" for frequencies higher than roughly 1 GHz. Another problem of the prior art clock divider circuits is that clock jitter introduced by them has been greater than the needed low level of clock jitter, which is as low as a few pico-seconds for some PLL applications.

Some of the known clock dividers are based on high speed custom-designed logic circuits, and other known clock dividers are based on standard library logic circuit cells. The known clock dividers based on standard library cells are not capable of operating at sufficiently high frequencies to be useful in high speed PLL circuits that operate at frequencies above roughly 500 MHz to 1 GHz. At the present state of the art, it would be very desirable in some applications to have a 6-bit (for example) programmable counter, which nevertheless is constructed of logic circuit cells from a standard CMOS cell library and which is capable of operating at 1.5 GHz. However, no presently available 6-bit programmable counter constructed of cells from any typical standard cell CMOS library can operate at more than roughly 500 MHz to 1 GHz.

So-called standard library logic cells are inadequate for use in a programmable high-speed clock divider capable of operating at frequencies above roughly 500 MHz to 1 GHz because such standard library logic cells are not capable of operating reliably at frequencies above roughly 500 MHz to 1 GHz, whereas in applications to which the subsequently described invention is directed, the logic gates need to have gate delays of less than 1 nanosecond.

It should be appreciated that the topographies of individual standard library cells ordinarily are optimized primarily for easy layout and easy use by conventional automatic integrated circuit design tools. This usually results in standard cells not being optimized for high speed operation. Therefore, logic circuits which are implemented using standard cells generally have limited operating speed. If high speed circuit operation is required, standard library cells generally can not be used, and instead a time consuming and costly "custom" layout is required.

Libraries of so-called standard logic cells usually include logic gate cells and flip-flop cells. A characteristic of typical standard library cells is that they all have the same height, although they may have different widths. The individual logic cells also have well defined input and output connection point locations and well-defined power connection point locations, in order to allow rapid, automatic routing of interconnect conductors between connection points of various cells in rows of standard cells. Such standard logic circuit cells therefore may be readily and rapidly arranged side-by-side as "tiles" in an integrated circuit chip layout. Consequently, the topography of the logic circuit on a chip can be quickly and readily designed using standard logic circuit cells. In contrast, both the circuit design and the design of the integrated circuit layout of the above mentioned high speed, custom-designed logic circuits usually is time-consuming and costly.

As a practical matter, it would be difficult at the present state-of-the-art to design library cells which would be fast enough to meet the previously mentioned 1 nanosecond time requirements that would need to be met in order to provide a programmable 1.5 GHz clock divider. Consequently, if the above mentioned prior art clock dividers are to be programmable, e.g., are to have dynamic divide ratios, it would be necessary to provide costly, time-consuming custom integrated circuit designs and costly, time-consuming chip layouts.

Thus, there is an unmet need for a practical, economical clock divider circuit that is capable of accurately dividing clock frequencies, such as VCO output clock frequencies, without using special, complex extraordinarily high-speed logic circuitry.

There also is an unmet need for a practical, economical clock divider circuit capable of dividing signals of frequencies higher than roughly 500 MHz to 1 GHz which can, as a practical matter, be implemented using standard integrated circuit library cells, without substantial use of custom chip layout procedures.

There also is an unmet need for a practical, economical clock divider circuit capable of dividing signals of frequencies higher than roughly 500 MHz to 1 GHz in "fine programming steps" which can, as a practical matter, be implemented using standard integrated circuit library cells without substantial use of custom chip layout procedures.

There also is an unmet need for a practical, economical clock divider circuit capable of dividing signals of frequencies higher than roughly 500 MHz to 1 GHz with a low amount of clock jitter, of the order of a few pico-seconds, to provide an output clock, e.g., a PLL output clock, that is sufficiently stable for most applications.

There also is an unmet need for a practical, economical clock divider circuit capable of dividing signals of frequencies higher than roughly 500 MHz to 1 GHz which is capable of dividing by both static and dynamic dividing values.

SUMMARY OF THE INVENTION

It is an object of the invention to provide a practical, economical clock divider circuit that is capable of accurately dividing clock frequencies, such as VCO output clock frequencies, without using special extraordinarily high-speed logic circuitry.

It is another object of the invention to provide a practical, economical clock divider circuit capable of dividing signals of frequencies higher than roughly 500 MHz to 1 GHz which can, as a practical matter, be implemented using standard integrated circuit library cells, without substantial use of custom chip layout procedures.

It is another object of the invention to provide a practical, economical clock divider circuit capable of dividing signals of frequencies higher than roughly 500 MHz to 1 GHz in "fine programming steps".

It is another object of the invention to provide a practical, economical clock divider circuit capable of dividing signals of frequencies higher than roughly 500 MHz to 1 GHz in "fine programming steps" which can, as a practical matter, be implemented using standard integrated circuit library cells without substantial use of custom chip layout procedures.

It is another object of the invention to provide a practical, economical clock divider circuit capable of dividing signals of frequencies higher than roughly 500 MHz to 1 GHz with a low amount of clock jitter, of the order of a few pico-seconds, to provide an output clock, e.g., a PLL output clock, that is sufficiently stable for most applications.

It is another object of the invention to provide a practical, economical clock divider circuit capable of dividing signals of frequencies higher than roughly 500 MHz to 1 GHz which is capable of dividing by both static and dynamic dividing values.

Briefly described, and in accordance with one embodiment, the present invention provides a frequency adjusting circuit (10A) including an asynchronous finite state machine (AFSM) configured as a counter (20) having an input coupled to an input clock signal (CLK) for producing information representative of a plurality of phase signals (F0,F1,F2,F3) each of which is a divided-down representation of the input clock signal (CLK) and each of which is phase-shifted by a predetermined amount with respect to another of the phase signals (F0,F1,F2,F3). Programmable circuitry (22) for operates in response to both dynamic divide ratio information (DIV_RATIO) and the information representative of the plurality of phase signals (F0,F1,F2,F3) so as to generate an output clock signal (CLKOUT) that is divided down according to both the dynamic divide ratio information and the information representative of the plurality of phase signals (F0,F1,F2,F3). The information representative of the plurality of phase signals (F0,F1,F2,F3) includes a division factor by which the input clock signal (CLK) is divided and a phase difference between each of the plurality of phase signals and another of the phase signals.

In one embodiment, the counter (20) is configured as a loadable ring counter circuit, and wherein the programmable circuitry (22) includes a down counter (72) for receiving values of the divide ratio information (DIV_RATIO) and counting down from the values of the divide ratio information in response to a first one of the phase signals (F3) produced by the counter (20).

In one embodiment, the asynchronous finite state machine is composed of static CMOS library logic gate cells and the programmable counter circuit also is composed of static CMOS library cells.

In one embodiment, frequency adjusting circuit includes regeneration circuitry (65) responsive to a particular one of the phase signals (F2) for producing a plurality of regenerated phase signals (F0',F1',F2',F3') in response to the particular one (F2) of the phase signals, wherein the regenerated phase signals (F0',F1',F2',F3') represent the phase signals (F0,F1, F2,F3), respectively.

In the described embodiment, the programmable circuitry (22) includes a divide ratio generator (11) for generating the divide ratio information (DIV_RATIO) as a plurality of MSBs (DIV_RATIO(5:2)) and a plurality of LSBs (DIV_RATIO(1:0)). The programmable circuitry (22) includes a down counter (72) for receiving the plurality of MSBs (DIV_RATIO(5:2)), the down counter (72) being clocked by a particular one (F3') of the regenerated phase signals (F0',F1',F2', F3') to count down from a value of the MSBs (DIV_RATIO (5:2)) to a terminal count value so as to in effect partially determine a programmable amount of delay between a pulse of the input clock signal (CLK) and a subsequent corresponding pulse of the output clock signal (CLKOUT). The programmable circuitry (22) includes decoding circuitry (73) for decoding information (DIV_RATIO_LAT) representative of the LSBs (DIV_RATIO(1:0)), a latched count value (COUNT_LAT_P1,2,3), and the regenerated phase signals (F0',F1',F2',F3') to further determine the programmable amount of delay between the pulse of the input clock signal (CLK) and the subsequent corresponding pulse of the output clock signal (CLKOUT).

In the described embodiment, the decoding circuitry (73) includes a plurality of branches corresponding to the regenerated phase signals (F0',F1',F2',F3'), respectively, each branch including a first digital comparator (78A,B,C,D) for comparing the information (DIV_RATIO_LAT) representative of the LSBs (DIV_RATIO(1:0)) to a value (0, 1, 2, 3) identifying that branch and a second digital comparator (79A,B,C,D) for comparing a count value (COUNT) of an output of the down counter (72) to a predetermined count value for that branch, an ANDing circuit (80A,B,C,D) having a first input coupled to an output of the first digital comparator (78A,B,C,D), a second input coupled to an output of the second digital comparator (79A,B,C,D), a third input receiving a regenerated phase signal (F0',F1',F2',F3') corresponding to that branch, and an output coupled to an input of a flip-flop (81A,B,C) having an output coupled to a corresponding input of an ORing gate 83 an output of which produces a basic divided-down output clock signal.

In the described embodiment, the input clock signal (CLK) is the output of a voltage controlled oscillator (8) of a phase locked loop (1), and the divide ratio generator (11) includes a delta-sigma modulator (11A) for generating the divide ratio information.

In one embodiment, the invention provides a method for dividing a clock signal (CLK), including a configuring an asynchronous finite state machine as a counter (20) having an input coupled to the clock signal (CLK), operating the asynchronous finite state machine to produce at least one phase signal (F2) which is a divided-down representation of the input clock signal (CLK) and which contains information representative of a plurality phase signals (F0,F1,F2,F3) each of which is a divided-down representation of the input clock signal (CLK) and each of which is phase-shifted by a predetermined amount with respect to another of the phase signals (F0,F1,F2,F3), and operating a programmable counter circuit (22) in response to dynamic divide ratio information and in accordance with at least one of the phase signals (F0,F1,F2, F3) so as to generate an output clock signal (CLKOUT) that is divided down in accordance with both the dynamic divide ratio information and the information representative of the plurality of phase signals (F0,F1,F2,F3). The divide ratio information (DIV_RATIO) is provided as a plurality of MSBs (DIV_RATIO(5:2)) and a plurality of LSBs (DIV_RATIO(1:0)), and partially determining a programmable amount of delay between a pulse of the input clock signal (CLK) and a subsequent corresponding pulse of the output clock signal (CLKOUT) by loading the plurality of MSBs (DIV_RATIO(5:2)) into a down counter (72) and operating the down counter (72) to count down from a value of the MSBs (DIV_RATIO(5:2)) to a terminal count value.

In one embodiment, the invention includes providing decoding circuitry (73) for decoding information (DIV_RATIO_LAT) representative of the LSBs (DIV_RATIO(1: 0)), the count value (COUNT_LAT_P1,2,3) and the regenerated phase signals (F0',F1',F2',F3'), and further determining the programmable amount of delay between the pulse of the input clock signal (CLK) and the subsequent corresponding pulse of the output clock signal (CLKOUT) by providing a plurality of branches corresponding to the regenerated phase signals (F0',F1',F2',F3'), respectively, each branch including a first digital comparator (78A,B,C,D) for comparing the information (DIV_RATIO_LAT) representative of the LSBs (DIV_RATIO(1:0)) to a value (0, 1, 2, 3) identifying that branch and a second digital comparator (79A,B,C,D) for comparing a count value (COUNT) of an output of the down counter (72) to a predetermined value for that branch, an ANDing circuit (80A,B,C,D) having a first input coupled to an output of the first digital comparator (78A,B,C,D), a second input coupled to an output of the second digital comparator (79A,B,C,D), a third input receiving a regenerated phase signal (F0',F1',F2',F3') corresponding to that branch, and an output coupled to an input of a flip-flop (81A,B,C) having an output coupled to a corresponding input of an ORing gate 83 an output of which produces a basic divided-down output clock signal.

In the described embodiment, the invention includes forming the asynchronous finite state machine of static CMOS library cells.

In one embodiment, the invention provides a frequency adjusting circuit (10A) including asynchronous finite state machine means (20, 30,50-1/2/3) configured as a counter (20) having an input coupled to an input clock signal (CLK) for producing information representative of a plurality of phase signals (F0,F1,F2,F3) each of which is a divided-down representation of the input clock signal (CLK) and each of which is phase-shifted by a predetermined amount with respect to another, and programmable counter and control means (22) for operating in response to both dynamic divide ratio information (DIV_RATIO) and the information representative of the plurality of phase signals (F0,F1,F2,F3) so as to generate an output clock signal (CLKOUT) that is divided down according to both the dynamic divide ratio information and the information representative of the plurality of phase signals (F0,F1,F2,F3).

DETAILED DESCRIPTION OF THE PREFERRED EMBODIMENTS

Figure 1:
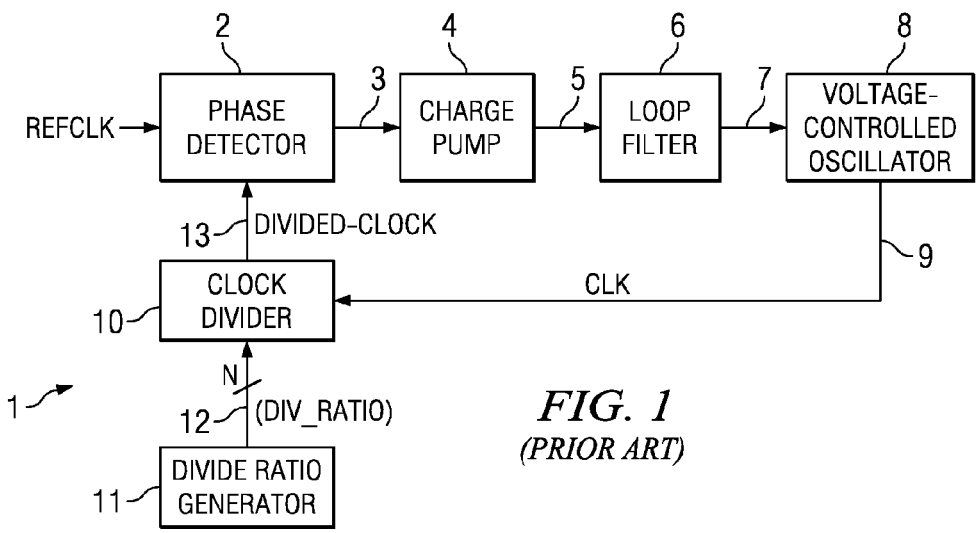
FIG. 1 is a is a block diagram of a conventional phase locked loop circuit.
Figure 2:
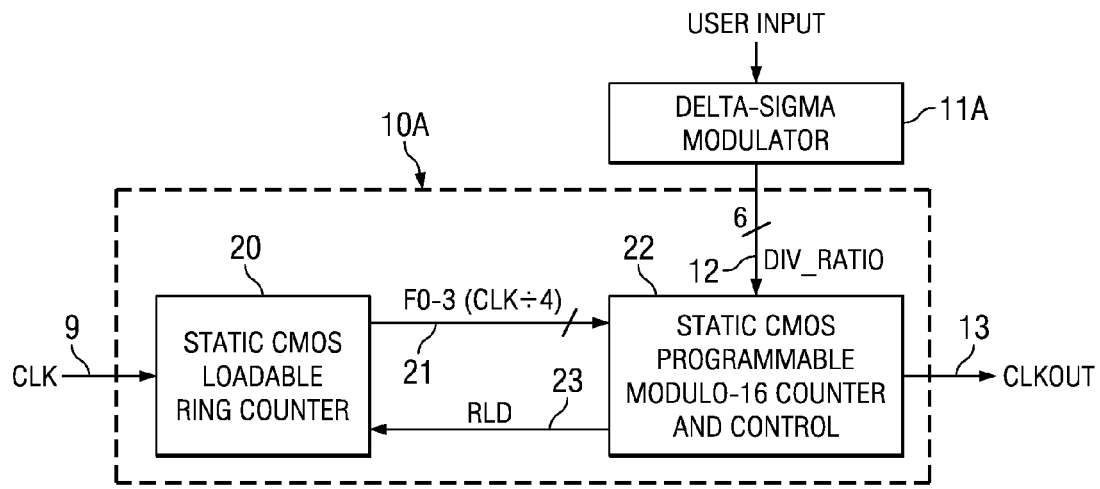
FIG. 2 is a circuit diagram of a high speed clock divider circuit of the present invention.
Figure 3:
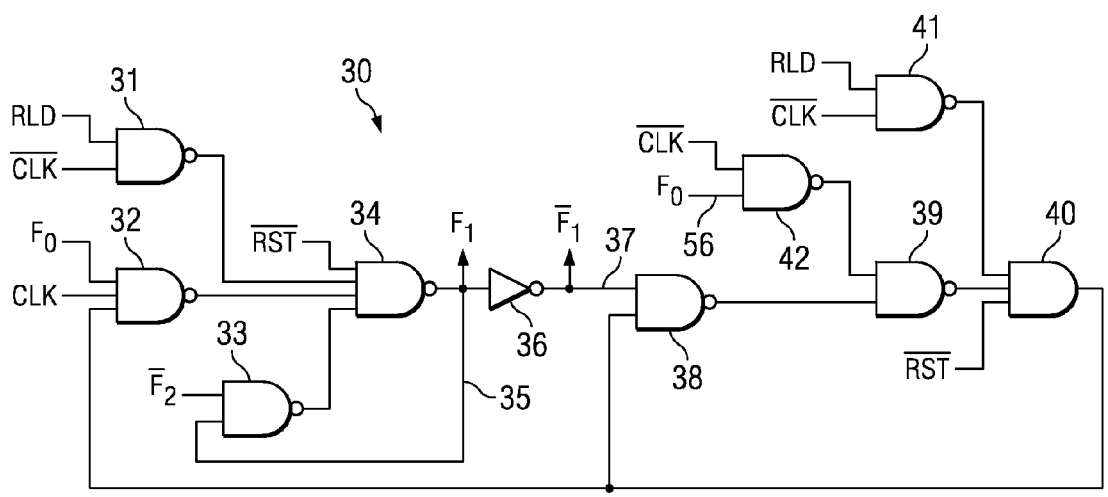
FIG. 3 is a circuit diagram of part of the asynchronous finite state machine circuitry of the loadable ring counter circuit in block 20 of FIG. 2.
Figure 4:
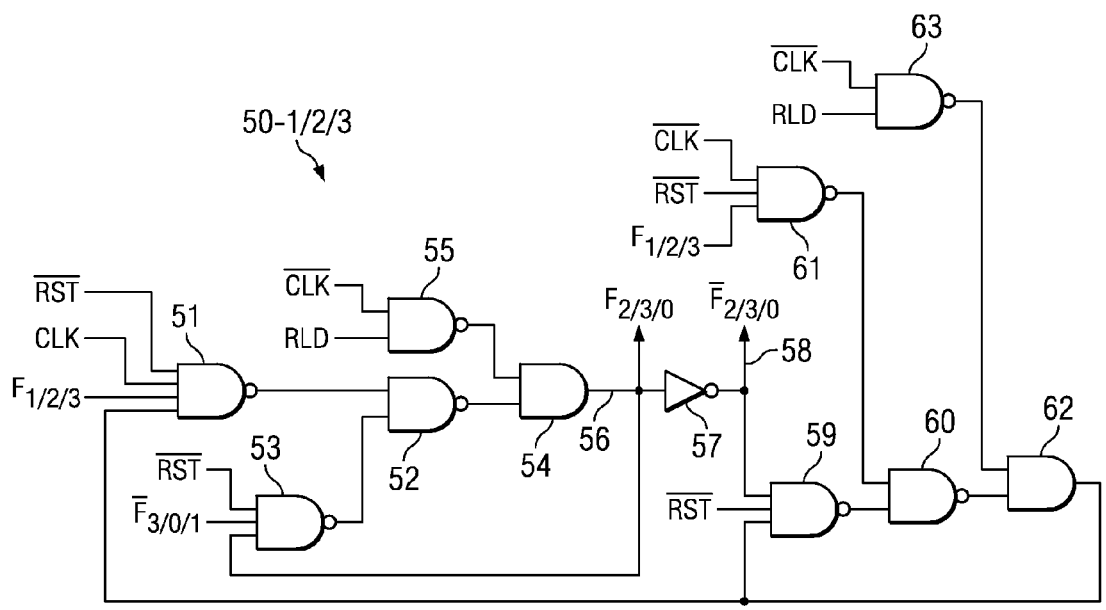
FIG. 4 is a block diagram of more asynchronous finite state machine circuitry of the loadable ring counter circuit in block 20 of FIG. 2.

FIG. 2 shows a clock divider 10A which can be used in accordance with the present invention to implement clock divider 10 in the PLL of Prior Art FIG. 1. FIG. 2 also shows a delta-sigma modulator 11A which can be used to implement the divide ratio generator 11 of Prior Art FIG. 1. Clock divider 10A of FIG. 2 includes a "loadable" ring counter circuit 20, details of which are shown in FIGS. 3 and 4. Ring counter circuit 20, which is implemented by means of an asynchronous finite state machine (AFSM) and can be constructed of static CMOS standard library cells, receives a high frequency clock input signal CLK on conductor 9. CLK can be the input to clock divider 10 from VCO 9 in FIG. 2. The frequency of CLK can be substantially greater than approximately 1 GHz, for example 1.5 GHz. Clock divider 10A divides clock signal CLK based on the divide ratio value DIV_RATIO it receives from divide ratio generator 11A, independently of the kinds of phase comparator, PLL architecture, and divide ratio generator that are used. (For example, in some clock division applications a pseudorandom number generator could be utilized to generate the divide ratio.)

Those skilled in the art know that in "static CMOS circuitry", the output terminals of each static CMOS stage always have either a conductive path to the positive power supply voltage through one or more turned-on P-channel MOS transistors or a conductive path to the negative power supply voltage through one or more turned-on N-channel MOS transistors. In general, the term "CMOS circuitry" encompasses "static CMOS circuitry" and "dynamic CMOS circuitry". Static CMOS circuitry may also include transmission gates which typically include a P-channel MOS transistor connected in parallel with a N-channel transistor. Static CMOS circuitry does not require continuous clock signals or refresh signals to remain operative. "Dynamic CMOS circuitry" generally requires continuous clock signals and/or refresh signals to remain operative.

It should be understood that the basic circuit characteristic of counter circuit 20 is the characteristic of a ring counter. However, the function of a "classical" ring counter circuit 20 can be implemented by means of various kinds of circuitry, including a ring counter such as a shift register with its output coupled to its input, a Grey code counter, a binary counter, or an asynchronous finite state machine (AFSM). An AFSM is an asynchronous circuit which includes logic gates (which includes inverters), but does not include any storage elements, such as flip-flops, register bits, or switched capacitor circuits.

Clock divider 10A shown in FIG. 2 also includes programmable modulo-16 counter and control circuit 22 and delta-sigma modulator 11A, which also can be implemented by means of static CMOS library cells. Clock divider 10A preferably is used as a dynamically programmable feedback divider circuit which can be coupled between the output of VCO 8 and the feedback input of phase detector 2 of the otherwise conventional PLL 1 shown in Prior Art FIG. 1.

Figure 5:
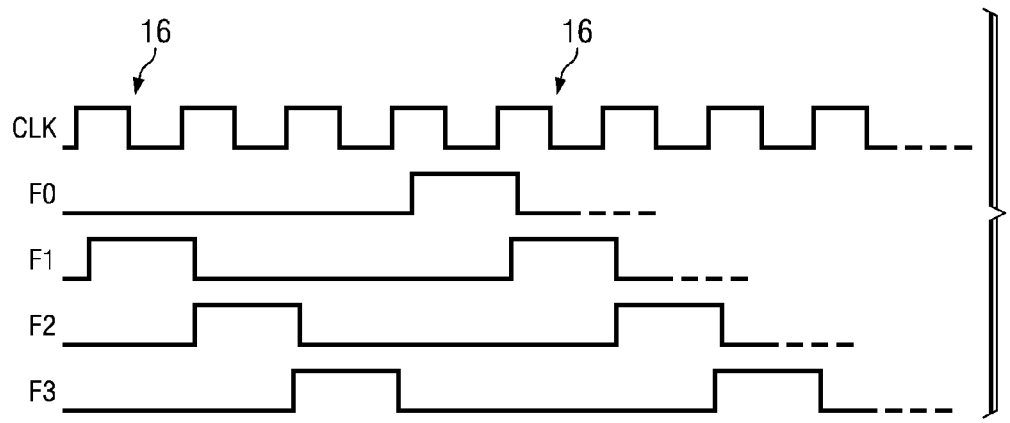
FIG. 5 is a timing diagram illustrating the various clock phase signals generated by the combined circuitry shown in FIGS. 3 and 4.

Ring counter circuit 20 produces four "phase signals" F0, F1, F2, and F3, as shown in the timing diagram of FIG. 5, on the 4 conductors of bus 21. Each of phase signals F0, F1, F23, and F3 has a frequency equal to one fourth the frequency of CLK and each is separated in phase by 90 degrees from the previous one. The four phase signals F0, F1, F2, and F3 are applied to inputs of programmable modulo-16 counter and control circuit 22, details of which are shown in FIGS. 6-9. Counter and control circuit 22 generates reload signal RLD which is coupled by conductor 23 to a reload input of ring counter circuit 20. RLD is a reload signal generated by counter and control circuit 22 every time a pulse of divided-down output clock signal CLKOUT is generated. Counter and control circuit 22 produces the divided-down output signal CLKOUT on conductor 13, which, as indicated in Prior Art FIG. 1, can be applied to the feedback input of phase detector 2 of PLL 1. RST is a power on reset signal.

Ring counter circuit 20 is the first stage of the 2-stage clock divider 10A, and programmable counter and controller circuit 22 is the second stage thereof. Ring counter circuit 20 is the high-speed part of clock divider 10A and operates at the VCO output clock frequency, which can be as high as approximately 1.5 GHz or more. Ring counter circuit 20 generates the four internal phase signals F0, F1, F2 and F3 such that each has a phase 90 degrees from the previous one, each at a frequency that is ¼th of the frequency of CLK. The four internal phase signals F0,F1,F2,F3, or "regenerated" versions thereof, then are used in counter and control circuit 22.

It should be appreciated that ring counter circuit 20 can be designed to provide more or less than the 4 above mentioned internal phase signals wherein each phase signal has a frequency more or less than ¼ the frequency of CLK.

Clock divider circuit 10A can include 6 divide ratio conductors 25 connected to the output of a delta-sigma modulator 11A which can provide a variable or dynamically changing divide ratio to clock divider 10A.

In response to the generation of each reload pulse RLD on conductor 23, ring counter circuit 20 is loaded with initial states of phase signals F0,F1,F2,F3, as indicated by arrow 16 in FIG. 5. For example, phase signal F1 initially can be a "1, in which case the other three phase signals F0, F2 and F3 are "0"s. After each initial loading of ring counter circuit 20, it continues its regular sequence wherein after the cycle in which phase signal F1 is equal to "1", phase signal F2 goes to a "1" during the next cycle, and during the cycle after that phase signal F3 goes to a "1", somewhat analogously to a "1" propagating through a shift register, in synchronization with CLK. The initial power on reset signal RST also can load the same initial values of F0,F1,F2,F3 in ring counter circuit 20 when power is first applied to the circuit.

Ring counter circuit 20 can be implemented by means of the asynchronous FSM circuit 30 in FIG. 3 along with the three asynchronous FSM circuits 50-1,2,3 in FIG. 4. The implementation of ring counter circuit 20 by means of asynchronous finite state machine, especially if implemented with standard static CMOS library cells, distinguishes clock divider 10A of FIG. 2 from the prior art. The inputs to FIGS. 3 and 4 include CLK, $\overline{CLK}$, RST, $\overline{RST}$, and RLD.

It should be understood the AFSM used to implement ring counter circuit 20 of FIG. 2 actually only needs to generate a single signal, which then can be used to "regenerate" phase signals F0,F1,F2,F3. Some of the plurality of phase signals may be "implicit" signals that are represented by and derivable from a single phase signals that is a physical signal produced by the AFSM. That is, if only a single phase signal (e.g., F2) is generated by ring counter circuit 20 (or other counter circuit that is configured to function as a ring counter) and then is used to "regenerate" the four phase signals F0', F1',F2',F3', then all of the information represented by the regenerated phase signals F0',F1',F2',F3', including the part of the division factor by which the ring counter divides the input clock signal CLK and the phase difference between each of the regenerated phase signals and the next one, all must be contained in or encoded in the single phase signal (for example, the phase signal F2) actually generated by ring counter circuit 20 and then used to produce the four regenerated phase signals F0',F1',F2',F3' as shown in subsequently described FIG. 6.

The inputs to programmable counter and control circuit 22 can be the four regenerated phase signals F0,F1,F2,F3 actually generated by the AFSM circuitry including circuit 30 of FIG. 3 and the three AFSM circuits 50-1,2,3 of FIG. 4. Alternatively, any one of the regenerated phase signals F0',F1',F2', F3', for example F2, can be used as an input to a phase signal regeneration circuit, such as phase signal regeneration circuit 65 of subsequently described FIG. 6, to cause it to regenerate all four of the original phase signals as regenerated phase signals F0',F1',F2',F3' which are used as inputs to the programmable counter and control circuitry in block 22 in FIG. 2. The regenerated phase signals F0',F1',F2',F3' are better synchronized to CLK than the original F0,F1,F2,F3 produced by ring counter circuit 20.

The 6-bit divide ratio value DIV_RATIO on bus 12 in FIG. 2 also is an input to programmable counter and control circuit 22. (Of course, a divide ratio having a different number of bits can be used.) The 4 MSBs (most significant bits) of 6-bit divide ratio value DIV_RATIO determine the initial value of the 4-bit signal COUNT being generated by down counter 72 of subsequently described FIG. 7.

The two LSBs (least significant bits) of DIV_RATIO(1:0) are used to select one of the 4 regenerated phase signals F0',F1',F2',F3' (or the four phase signals F0,F1,F2,F3 if they are not regenerated), to thereby contribute to the determination of the amount by which CLK is divided to produce divided-down output clock signal CLKOUT.

Thus, clock divider 10A of the present invention is partitioned into high speed ring counter circuit 20 and low speed programmable counter and control circuit 22. Reloadable ring counter circuit 20, operating at, for example, 1.5 GHz, is designed as an asynchronous state machine (with no flip-flops) as shown in FIGS. 3 and 4, using standard static CMOS library cell components, instead of being designed by performing a time-consuming and costly circuit speed optimization design and instead of also performing an integrated circuit topography layout design so as to further optimize circuit speed.

A requirement of the clock divider of the present invention is that it divide the input clock CLK, which may have frequencies up to 1.5 GHz or more, into fine steps, i.e. into steps defined by a divisor having any of the 48 integer values between 15 and 63 (in the case of a modulo-16 counter). Ring counter circuit 20 implemented by means of AFSM circuitry in this example provides a very high speed ÷4 function. Programmable counter 22 performs a substantially lower speed ÷N function using only static CMOS library cell logic gates (including inverters) where N is an integer between 0 and 15, based on the value of COUNT. That, combined with the ÷4 function performed ring counter circuit 20, can provide any user-selected integral divisor in the range from 15 to 63. (Of course, ring counter circuit 20 and programmable counter 22 can be designed to provide division by other integer values.) Another requirement of the clock divider of the present invention is that it support dynamically changing clock frequency division values of DIV_RATIO. Another requirement is that the clock divider 10A generate a low amount, e.g. only a few picoseconds per second, of jitter in CLKOUT.

The low-speed divider stage, i.e., programmable counter and control circuit 22, is implemented as a reloadable counter and also is composed of static CMOS standard-cell components, including gates and flip-flops. In one embodiment, programmable counter and control circuit 22 operates at 375 MHz. The divided-down output clock signal CLKOUT is generated according to selected ones of the four regenerated phase signals F0',F1',F2',F3', which are selected according to the two LSBs DIV_RATIO(1:0) and are synchronized to the input clock CLK, which can be the VCO output of a PLL.

Ring counter circuit 20 can be implemented by means of the asynchronous logic circuit 30 of FIG. 3 which generates the above mentioned phase signal F1, and also by means of the three asynchronous logic circuits 50-1/2/3 of FIG. 4 which generate phase signals F0, F2 and F3, respectively.

FIG. 3 shows asynchronous circuit 30 including 2-input NAND gate 31 having one of its inputs coupled to RLD and its other input coupled to $\overline{CLK}$. The output of NAND gate 31 is connected to the input of a 4-input NAND gate 34. A 3-input NAND gate 32 has one input coupled to F0, another input coupled to CLK, and another input coupled to the output of 3-input AND gate 40. The output of NAND gate 32 is connected to another input of NAND gate 34. A 2-input NAND gate 33 has one input coupled to $\overline{F2}$ and another input coupled to the output F1 of NAND gate 34. The remaining input of NAND gate 34 is coupled to $\overline{RST}$. The output F1 of NAND gate 34 is coupled to the input of an inverter 36, the output $\overline{F1}$ of which is connected to one input of a 2-input NAND gate 38. The output of NAND gate 38 is connected to one input of 2-input NAND gate 39, the other input of which is connected to the output of NAND gate 42. One input of NAND gate 42 is coupled to $\overline{CLK}$, and its other input is coupled to F0. The output of NAND gate 39 is connected to one input of AND gate 40, another input of which is coupled to $\overline{RST}$. The remaining input of AND gate 40 is connected to the output of a 2-input NAND gate 41, one input of which is coupled to RLD, the other input of which is coupled to $\overline{CLK}$.

FIG. 4 shows an asynchronous circuit 50-1/2/3 which actually represents three separate asynchronous circuits 50-1, 50-2, and 50-3. Illustrated asynchronous circuit 50-1/2/3 is shown as producing the signals F1/2/3, $\overline{F3/0/1}$, F2/3/0, and $\overline{F2/3/0}$. This means that asynchronous circuit 50-1 produces the signals F1, $\overline{F3}$, F2, and $\overline{F2}$, that asynchronous circuit 50-2 produces the signals F2, $\overline{F0}$, F3, and $\overline{F3}$, and that asynchronous circuit 50-3 produces the signals F3, $\overline{F1}$, F0, and $\overline{F0}$. Asynchronous circuit 50-1/2/3 includes 4-input NAND gate 51, one input of which is coupled to $\overline{RST}$, another input being coupled to CLK, another input being coupled to F1/2/3, and the remaining input being coupled to the output of a 2-input AND gate 62. The output of NAND gate 51 is connected to the input of a 2-input NAND gate 52, the other input of which is connected to the output of a 3-input NAND gate 53. One input of NAND gate 53 is coupled to $\overline{RST}$, another input being coupled to $\overline{F3/0/1}$, and the remaining input being coupled to the output F2/3/0 of a 2-input AND gate 54. The output of NAND gate 52 is connected to one input of AND gate 54, the other input of which is connected to the output of a 2-input NAND gate 55. One input of NAND gate 55 is coupled to $\overline{CLK}$, the other input being coupled to RLD. The output F2/3/0 of AND gate 54 also is connected to the input of an inverter 57, the output $\overline{F2/3/0}$ of which is coupled to one input of a 3-input NAND gate 59, another input being coupled to $\overline{RST}$, and the remaining input being coupled to the output of AND gate 62. The output of NAND gate 59 is coupled to one input of a 2-input NAND gate 60, the other input of which is connected to the output of a 3-input NAND gate 61. One input of NAND gate 61 being coupled to $\overline{CLK}$, and another input is coupled to $\overline{RST}$, the remaining input being coupled to F1/2/3. The output of NAND gate 60 is connected to one input of AND gate 62, another input being connected to the output of a 2-input NAND gate 63, one input of which is coupled to $\overline{CLK}$, the other input being coupled to RLD.

AFSM circuitry 30 and 50-1/2/3 of FIGS. 3 and 4, respectively, shows the use of self-feedback combinational logic circuits without flip-flops. The outputs of these combinational logic circuits are connected back to inputs thereof in order to advance the logic states of the combinational logic circuits in response to each transition of the input signal. Therefore, any transition of the input signal will cause the AFSM composed of the circuitry shown in FIGS. 3 and 4 to change state accordingly so as to advance each bit on the correct condition. (For example, in FIG. 3 there are 3 feedback lines, one from F1 to the input of NAND gate 33, and one from the output of gate 40 to the input of gate 38, and a third one from the output of gate 40 to the input of gate 32. Those are the feedback controls for the AFSM circuitry 30.) The interconnections of the four asynchronous combinational logic circuits in FIGS. 3 and 4 which implement ring counter circuit 20 of FIG. 2 are shown by the labels indicated in FIGS. 3 and 4 for the various inputs and outputs of the various gates, respectively.

It should be noted that in one embodiment of the invention, ring counter circuit 20 is implemented as an AFSM circuit and is composed of static CMOS standard library cell components. The rest of the circuitry of clock divider 10A is not AFSM circuitry, and also is composed of static CMOS standard library cell components. In contrast, all of the known prior art programmable high-speed clock divider circuits use flip-flops (and therefore are not AFSMs) to perform the dividing function of ring counter circuit 20.

Figure 6:
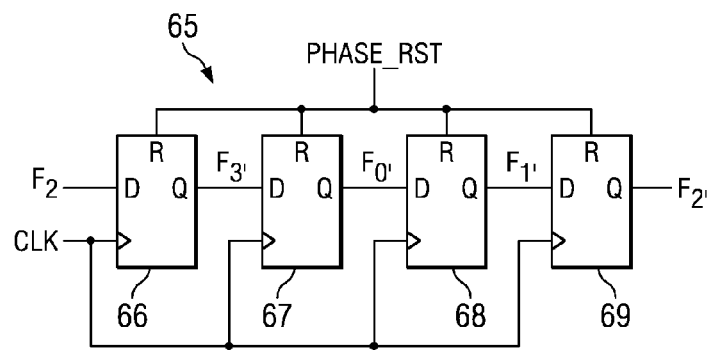
FIG. 6 is a diagram of logic circuitry for regenerating phase signals produced by the ring counter circuit in block 20 in the programmable counter and control circuit in block 22 of FIG. 2.
Figure 7:
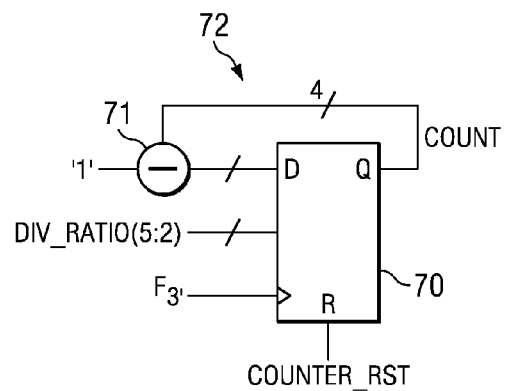
FIG. 7 is a circuit diagram of a circuit for down-counting from the value of the 4 MSBs of DIV_RATIO loaded therein.

FIG. 6 shows how the F0,F1,F2,F3 actually or inherently generated by ring counter circuit 20 are "regenerated" as regenerated phase signals F0',F1',F2',F3' from just one phase signal, in this case F2 from ring counter circuit 20. FIG. 7 shows a 4-bit down-counter 72, which performs the function of providing 16 different values of COUNT that are determined by the four MSBs DIV_RATIO(5:2) of the divide ratio signal DIV_RATIO, at one fourth the frequency of CLK, for use in subsequently described FIGS. 8 and 9.

In FIG. 6, phase signal regeneration circuit 65 includes D-type flip-flops 66, 67, 68, and 69 each clocked by CLK. The reset input R of each flip-flop is coupled to the phase reset signal PHASE_RST, which occurs in response to either reload signal RLD or power on reset signal RST. Phase signal F2 from ring counter circuit 20 is coupled to the D input of flip-flop 66, the output Q of which produces the regenerated phase signal F3' that is applied to the D input of flip-flop 67. (It should be understood that phase signal regeneration circuit 65 could easily be slightly modified so as to respond to any one of the other phase signals F0, F1 or F3 instead of F2.) The output Q of flip-flop 67 produces regenerated phase signal F0', which is applied to the D input of flip-flop 68. The Q output of flip-flop 68 produces regenerated phase signal F1', which is applied to a D input of flip-flop 69, the output of which produces the regenerated phase signal F2'. The four regenerated phase signals all are precisely synchronized to CLK, and each is separated in phase from the previous one by 90 degrees. Regenerated phase signals F0',F1',F2',F3' (instead of original phase signals F0,F1,F2,F3) are used in the circuits of subsequently described FIGS. 7-9.

FIG. 7 is a block diagram of 4-bit down counter 72, which counts down to a "terminal count" value of 0 (although the terminal count could be a value different than zero), at a rate equal to ¼th of the frequency of CLK, from the value of the four MSBs DIV_RATIO(5:2) provided by delta-sigma modulator 11A. The count values of COUNT are latched as indicated in latches 75A, 75B and 75C, respectively, in FIG. 8 and then used by the condition decoder circuitry 73 as determined by F0', F1', F2' or F3' in subsequently described FIG. 9 to establish a programmable amount of delay between a particular pulse of CLK and a corresponding pulse of divided-down output clock CLKOUT, to thereby establish the programmable frequency of the divided-down output signal CLKOUT in accordance with the value of DIV_RATIO.

Down-counter circuit 72 of FIG. 7 includes a 4-bit D-type down counter circuit 70 which is clocked at the one fourth of the frequency of CLK by regenerated phase signal F3' from FIG. 6. The reset input R of 4-bit down counter 70 is coupled to a counter reset signal COUNTER_RST. The 4-bit D input of flip-flop circuit 70 is coupled to the output of a substracter 71 which receives a "1" on its (−) input and receives the 4-bit down counter output signal COUNT on its (+) input D. The output of subtractor 71 is connected to the 4-bit D input of a down counter 70. A signal COUNTER_RESET loads the four MSBs DIV_RATIO(5:2) of the divide ratio into 4-bit down counter 72. Down counter 72 then down-counts in decrement values of 1 from that value.

Figure 8:
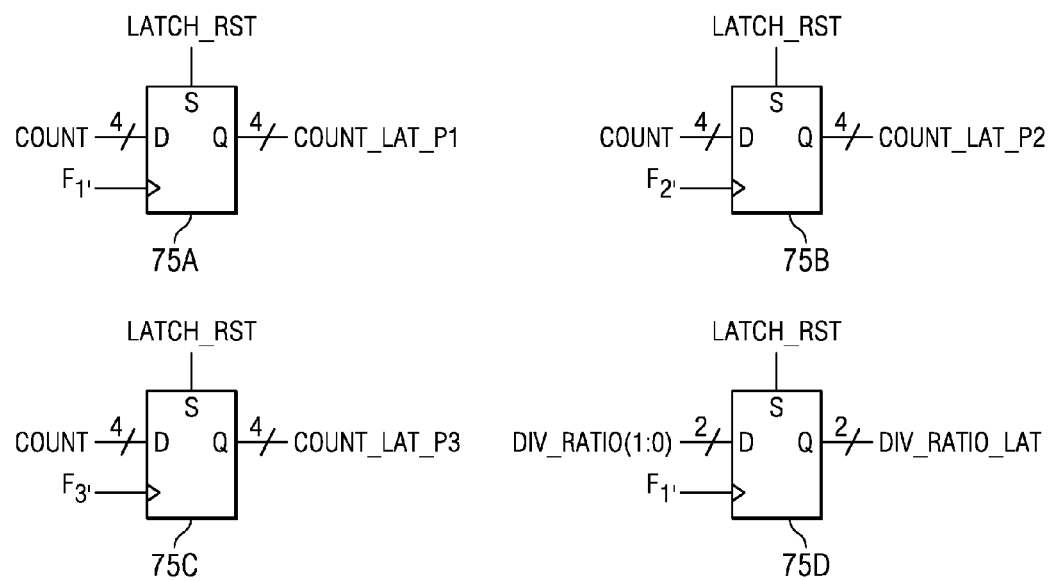
FIG. 8 is a diagram of circuitry in block 22 of FIG. 2 in which counter signals and divide ratio signals are latched before being used elsewhere in FIG. 2.

FIG. 8 is a diagram of various latch circuits within control logic block 91 of subsequently described FIG. 9, in which the terminal values of COUNT is latched. The amount of time required for COUNT to reach its terminal count value corresponds to the present value of the four MSBs DIV_RATIO (5:2). FIG. 8 includes four D-type latch circuits 75A, 75B, 75C and 75D. 4-bit circuit 75A is clocked at one fourth of the frequency of CLK by regenerated phase signal F1'. The set input S of each of latch circuits 75A-D receives a latch reset signal LATCH_RST. The output Q of latch circuit 75A produces a 4-bit latched counter signal COUNT_LAT_P1. Similarly, 4-bit latch circuit 75B is clocked by regenerated phase signal F2' and receives the 4-bit counter signal COUNT on its D input. The output Q of latch circuit 75B produces a 4-bit latched counter signal COUNT_LAT_P2. 4-bit latch circuit 75C is clocked by regenerated phase signal F3' and receives the 4-bit counter signal COUNT on its D input. The output Q of latch circuit 75C produces a 4-bit latched counter signal COUNT_LAT_P3.

2-bit latch circuit 75D is clocked by regenerated phase signal F1' and receives the 2 LSBs DIV_RATIO(1:0) of the divide ratio on its D input. The set input S of latch circuit 75D receives latch reset signal LATCH_RST. The output Q of latch circuit 75D produces a 2-bit latched divide ratio signal DIV_RATIO_LAT having the value of the 2 LSBs of DIV_RATIO.

Figure 9:
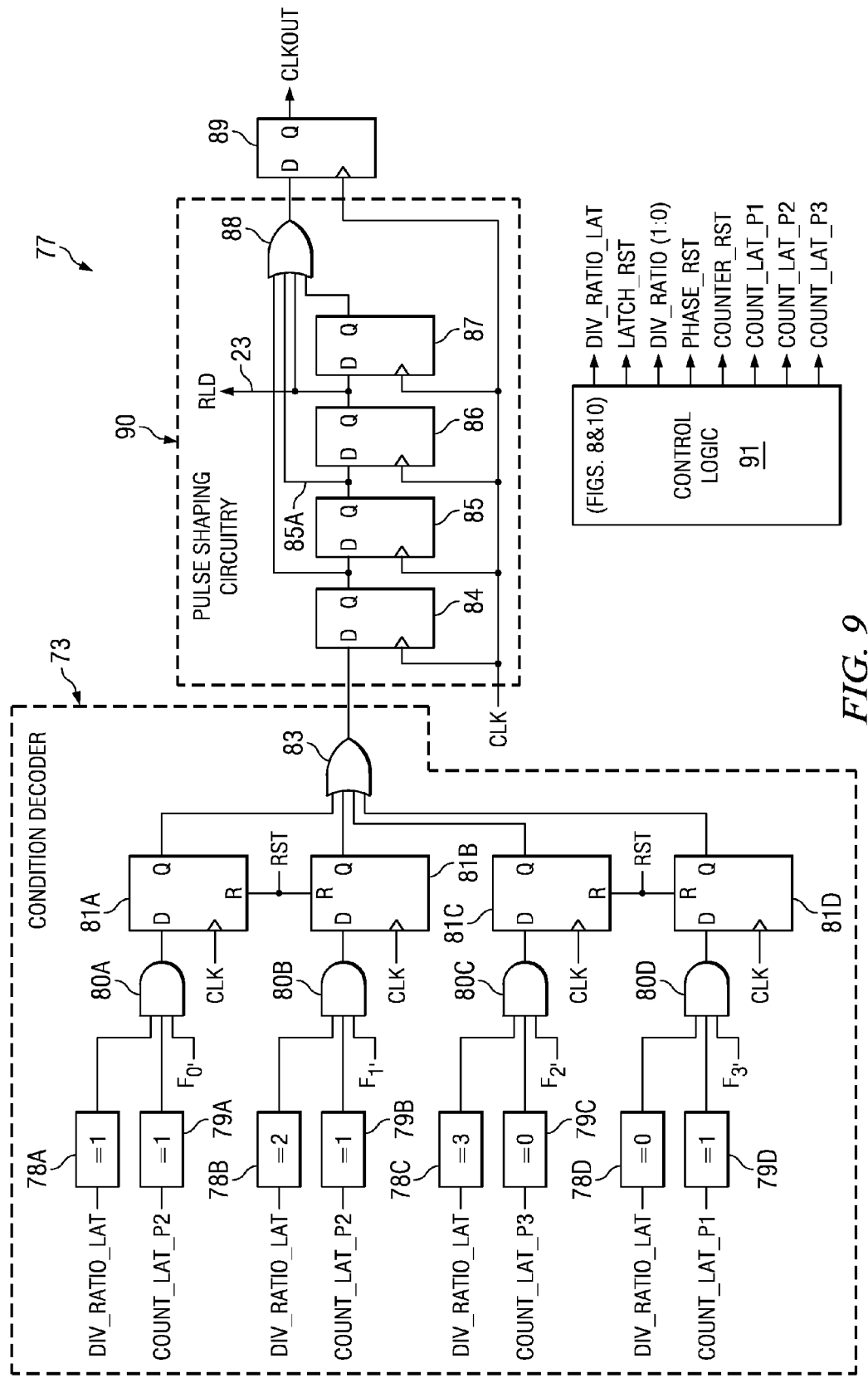
FIG. 9 is a detailed logic diagram of condition decoder and output clock generation circuitry in block 22 of FIG. 2.

FIG. 9 is a detailed logic diagram of the main control circuitry 77 in block 22 which generates the divided-down output clock CLKOUT in FIG. 2. The terminal value of the above mentioned 4-bit value of COUNT is latched on the rising edges of the regenerated phase signals F1', F2', and F3' as shown in FIG. 8 in order to provide adequate time for circuit operation and then is used in the corresponding portions of the condition decoder 73 of control logic 77 as shown in FIG. 9. (The various latched values of the terminal value of COUNT are needed because part of the logic circuitry in FIG. 9 operates in synchronization with the fast 1.5 GHz clock CLK, wherein one cycle of CLK is less than 1 nanosecond and therefore is too fast to allow the un-latched signal COUNT to be effectively utilized.) Therefore, the corresponding terminal values of COUNT are latched at the rising edges of the regenerated phase signals F1', F2' and F3' as shown in latches 75A, 75B and 75C, respectively, in FIG. 8. DIV_RATIO(1:0) is latched into 2-bit latch 75D on the rising edge of regenerated phase signal F1'. The two divide ratio LSBs DIV_RATIO(1:0) are used to select one of the four "branches" of condition decoder 73 in FIG. 9.

A top is, bar or first branch of condition decoder 73 in FIG. 9 includes a digital comparator 78A having an input coupled to the 2-bit latched divide ratio signal DIV_RATIO_LAT, which is compared with the value "1". Digital comparator 78A also has an output coupled to one input of a 3-input AND gate 80A, the output of which is coupled to the D input of a D type flip-flop 81A. 2-bit digital comparator 78A, a 4-bit digital comparator 79A, AND gate 80A and flip-flop 81A constitute the above mentioned top branch of condition decoder 73. Another input of AND gate 80A is connected to the output of a 4-bit digital comparator 79A having an input coupled to the 4-bit latched count signal COUNT_LAT_P2, which is compared with the value "1". A third input of AND gate 80A is coupled to the regenerated phase signal F0', to which the top or first branch corresponds. The reset input R of flip-flop 81A is coupled to RST. The Q output of flip-flop 81A is coupled to one input of a 4-input OR gate 83.

A second branch of condition decoder 73 includes 2-bit digital comparator 78B having an input coupled to receive the latched divide ratio signal DIV_RATIO_LAT, which is compared with the value "2". Comparator 78B has an output coupled to one input of a 3-input AND gate 80B, the output of which is coupled to the D input of a D type flip-flop 81B. Another input of AND gate 80B is connected to the output of a 4-bit digital comparator 79B having an input coupled to receive the 4-bit latched count signal COUNT_LAT_P2, which is compared with the value "1". A third input of AND gate 80B is coupled to the regenerated phase signal F1'. The reset input R of flip-flop 81B is coupled to RST. The Q output of flip-flop 81B is coupled to a second input of 4-input OR gate 83. Similarly, a third branch of condition decoder 73 includes a 2-bit digital comparator 78C having an input coupled to the latched divide ratio signal DIV_RATIO_LAT, which is compared with the value "3". Comparator 78C has an output coupled to one input of a 3-input AND gate 80C, the output of which is coupled to the D input of a D type flip-flop 81C. Another input of AND gate 80C is connected to the output of a 4-bit digital comparator 79C having an input coupled to the latched count signal COUNT_LAT_P3, which is compared with the value "0". A third input of AND gate 80C is coupled to regenerated phase signal F2'. The reset input R of flip-flop 81C is coupled to RST. The Q output of flip-flop 81C is coupled to a third input of 4-input OR gate 83. A fourth branch of condition decoder 73 includes a digital comparator 78D having an input coupled to the latched divide ratio signal DIV_RATIO_LAT, which is compared with the value "0". Comparator 78D also has an output coupled to one input of a 3-input AND gate 80D, the output of which is coupled to the D input of a D type flip-flop 81D. Another input of AND gate 80D is connected to the output of a comparator 79D having an input coupled to the latched count signal COUNT_LAT_p1, which is compared with the value "1". A third input of AND gate 80D is coupled to the regenerated phase signal F3'. The reset input R of flip-flop 81D is coupled to RST. The Q output of flip-flop 81D is coupled to a fourth input of 4-input OR gate 83.

The output of OR gate 83 represents the basic divided-down output clock signal produced by clock divider circuit 10A of FIG. 2. The basic divided-down output clock signal may have undesirable voltage "glitches" which are "cleaned up" by means of flip-flop 84, the D input of which is connected to the output of OR gate 83. Flip-flop 84, and also flip-flops 85, 86, and 87, all are clocked by CLK. The Q output of flip-flop 84 is coupled both to the D input of flip-flop 85 and to one input of 4-input OR gate 88. The Q output of flip-flop 85 is connected both to the D input of flip-flop 86 and a second input of OR gate 88. The Q output of flip-flop 86 produces the reload signal RLD on the D input of flip-flop 87 by means of conductor 23 and also is connected to a third input of OR 88. The Q output of flip-flop 87 is connected to the fourth input of OR gate 88. Flip-flop 89, which is clocked by CLK, receives the "stretched" or extended divided-down output clock pulse produced by OR gate 88 and precisely synchronizes it with CLK to produce the final divided-down output clock signal CLKOUT.

The specific implementation of pulse shaping circuitry within dashed line 90, including flip-flops 85, 86, 87, and 88, provides "stretched" pulses representative of the basic divided-down output clock signal generated at the output of flip-flop 84. However, it should be appreciated that the circuitry 90 could be implemented in various other ways to produce the same or similar result.

Figure 10:
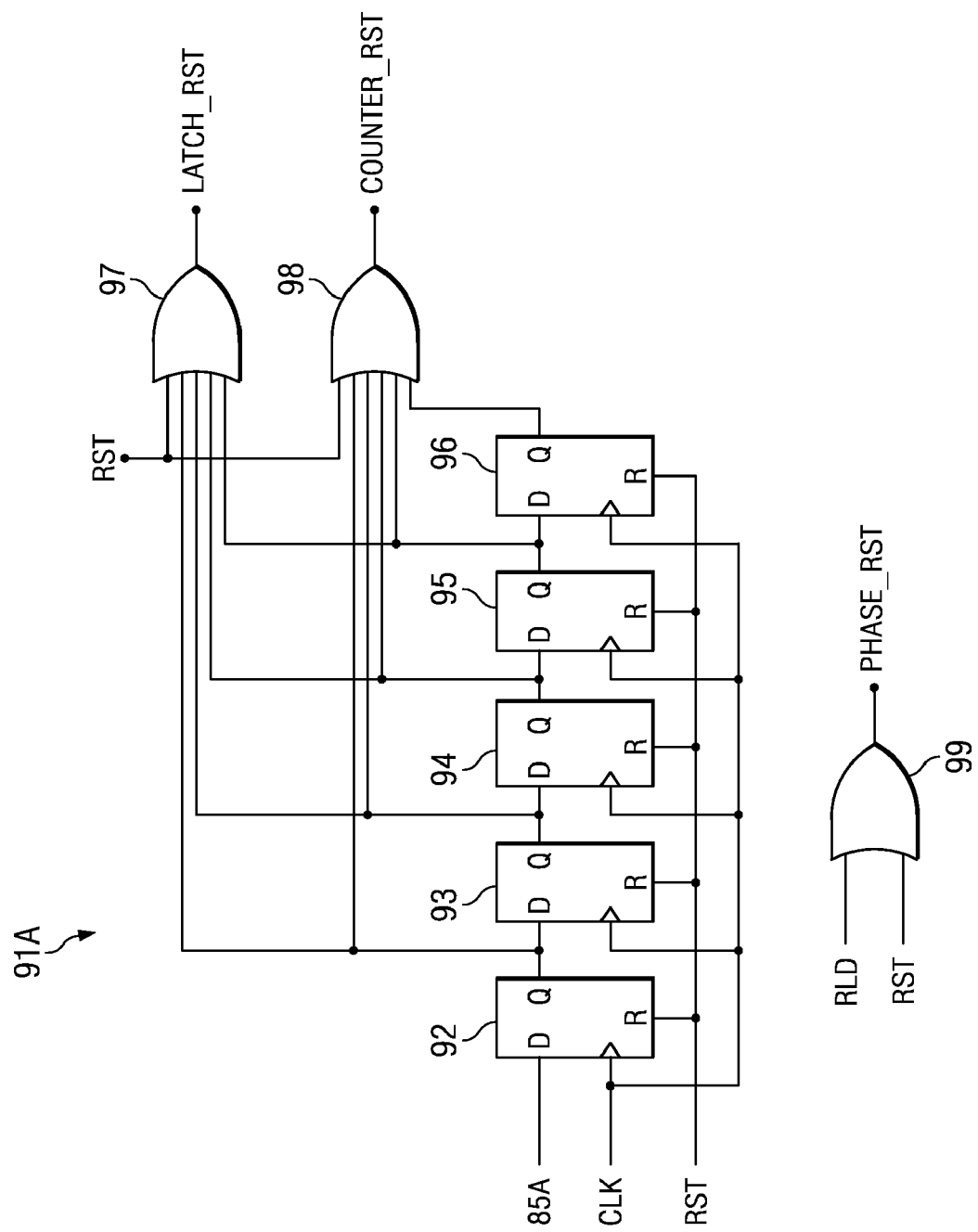
FIG. 10 shows part of the control circuitry in block 91 of FIG. 9.

Control circuitry 91 in FIG. 9 produces the various control signals PHASE_RST, COUNTER_RST, COUNT_LAT_P1, COUNT_LAT_P2, DIV_RATIO_LAT and COUNT_LAT_P3, as shown in more detail in FIGS. 8 and 10.

In condition decoder 73 of FIG. 9, the 4 above described branches that feed into OR gate 83 differ in that they may receive different values or "conditions" of COUNT_LAT_P1, COUNT_LAT_P2, and COUNT_LAT_P3, and different regenerated phase clocks F0', F1', F2' and F3'. Therefore, the 4 branches correspond to the four regenerated phase signals F0',F1',F2',F3', respectively. The top or first branch corresponds to phase signal F0', and the lower second, third and fourth branches correspond to phase signals F1', F2' and F3', respectively. In the top branch including digital comparators 78A and 79A, the value of the 2-bit signal DIVIDE_RATIO_LAT is compared with "1", and the comparison result is input to AND gate 80A. That means if DIVIDE_RATIO_LAT and COUNT_LATCH_P2 are "1" during phase signal F0', then AND gate 80A generates a "1" which is latched into D-type latch 81. That means CLKOUT is produced so as to correspond to regenerated phase signal F0', which was selected by the two LSB bits DIV_RATIO(1:1) of the present divide ratio. The output of flip-flop 81A would be a "1", which passes through OR gate 83 as a single pulse of the basic divided-down clock signal and is clocked by CLK through pulse shaping circuit 90 to thereby create the divided down output clock signal CLKOUT. The operation of each of the second, third, and fourth above mentioned lower branches and FIG. 9 is similar.

As previously mentioned, OR gate 83 of FIG. 9 provides a single cycle pulse which constitutes the basic divided-down clock signal that is used to generate CLKOUT. The single pulse produced at the output of OR gate 83 in response to one of the above mentioned branches then is passed through flip-flop 84 so as to provide a cleaner signal by eliminating voltage glitches that may be present at the output of OR gate 83. Flip-flops 85, 86, and 87 operate to generate a wider or "stretched" pulse of CLKOUT (for example to provide a 4 nanosecond pulse rather than a 1 nanosecond pulse). The CLK input to flip-flop 89 operates to eliminate any voltage glitches at the output of OR gate 88.

FIG. 10 shows a portion 91A of control logic 91 in FIG. 9, for generating the previously mentioned control signals LATCH_RST, COUNTER_RST, COUNTER_RST and PHASE_RST. Conductor 85A (from flip-flop 85 in FIG. 9) is coupled to the D input of flip-flop 92 of FIG. 10, the Q output of which is connected to the D input of flip-flop 93, one input of OR gate 98, and to one input of OR gate 97. The clock input of each of D-type flip-flops 92, 93, 94, 95 and 96 is connected to CLK. The reset input R of each of D-type flip-flops 92, 93, 94, 95 and 96 is connected to power on reset signal RST. The Q output of flip-flop 93 is connected to the D input of flip-flop 94, one input of OR gate 98, and to one input of OR gate 97. The Q output of flip-flop 94 is connected to the D input of flip-flop 95, one input of OR gate 98 and to one input of OR gate 97. The Q output of flip-flop 95 is connected to the D input of flip-flop 96, one input of OR gate 98, and to one input of OR gate 97. The Q output of flip-flop 96 is connected to one input of OR gate 98, the output of which produces COUNTER_RST. The remaining input of OR gate 97 and the remaining input of OR are coupled to RST. The output of OR gate 97 produces LATCH_RST. Thus, the signal COUNTER_RST is similar to LATCH_RST but is extended by the delay associated with flip-flop 96. Reload signal RLD and power on reset signal RST are coupled to the two inputs of 2-input OR gate 99, the output of which produces PHASE_RST.

By way of definition, the term "OR gate" as used herein is intended to encompass a gate that performs a logical ORing function that can be performed by either an OR gate or a NOR gate, and similarly, the term "AND gate" is intended to encompass a gate that performs a logical ANDing function that can be performed by either an AND gate or a NAND gate.

The value of the four divide ratio MSBs DIV_RATIO(5:2) and the associated value of COUNT and the value of the two divide ratio LSBs DIVIDE_RATIO(1:0) causes a decoded or selected one of the first, second, third and fourth branches in condition decoder 73 of FIG. 9 to produce a pulse that passes at an appropriate time through OR gate 83 to thereby produce a pulse of the basic divided-down output clock signal from which CLKOUT then is produced, depending on the time of occurrence of the count produced by down counter 72 of FIG. 7 and also depending on the time of occurrence of the rising edge of the regenerated phase signal (F0', F1', F2', or F3') which clocks the AND gate (80A, 80B, 80C, or 80D) of the decoded or selected branch. That AND gate then generates the pulse which passes through OR gate 83 to provide the "basic" divided-down clock signal which then is "shaped" to provide divided-down output clock signal CLKOUT.

More specifically, the 2 digital comparators and the AND gate in each of the first, second, third, and fourth branches determine whether both a particular latched count divide ratio condition and also a particular latched count condition are present. COUNT_LAT_P2 is compared with 1 by digital comparators 79A and 79B. COUNT_LAT_P3 is compared with 0 by digital comparator 79C, and COUNT_LAT_P1 is compared with 1 by digital comparator 79D. The latched divide ratio DIV_RATIO_LAT is compared with a decimal 1, 2, 3, and 0 by digital comparators 78A, 78B, 78C, and 78C, respectively, in order to decode or select which of the first, second, third and fourth branches will generate the next basic divided-down clock pulse. That determines which of regenerated phase signals F1', F2', F3', or F0' will clock the next basic divided-down clock pulse through the AND gate of the selected branch and into OR gate 83. For example, under the condition that the phase signal is F0' and the value COUNT_LAT_P2 is equal to 1, then digital comparators 78A and 79A each will produce a 1, enabling the next regenerated phase signal F0' to produce a corresponding pulse at the output of AND gate 80A. That pulse passes through OR gate 83 to produce the next basic divided-down clock pulse as an input to pulse shaping circuitry 90. The operation of the second, third, and fourth branches is similar.

Thus, the amount by which ring counter circuit 20 contributes to the dividing of CLK is always equal to 4 in the above described embodiment of the invention. The further amount of dividing of CLK is programmable in accordance with the present value of the 4 divide ratio MSBs DIV_RATIO(5:2). After down-counting of that value of DIV_RATIO(5:2) by down counter 72 of FIG. 7 at one fourth of the frequency of CLK, the resulting values of COUNT are latched into 4-bit latches 75A, 75B and 75C to produce latched count values COUNT_LAT_P1, COUNT_LAT_P2 and COUNT_LAT_P3. This determines the further amount of delay in addition to the amount of delay produced by ÷4 operation of ring counter circuit 20 that is introduced between the rising edge of a particular CLK pulse and the rising edge of the next divided-down CLKOUT pulse. That further amount of delay is equal to a programmable number of CLK pulse widths which depends on the value of DIV_RATIO(5:2), and thereby allows precise, programmable division of high frequency CLK signals by divisor values between 15 and 63.

Thus, the high frequency clock divider of the present invention uses an asynchronous finite state machine (AFSM) design that allows operation at frequencies above roughly 500 MHz to 1 GHz. Clock divider 10A divides the VCO clock CLK to a lower clock frequency domain (¼ of the VCO frequency CLK in the described example). The AFSM in ring counter circuit 20 is able to provide "single clock dividing accuracy" by using handshaking signal communication with programmable counter and control circuit 22. Programmable counter and control circuit 22 provides an adequate number of divide ratios and generates a low jitter clock to the PLL phase detector 2 (FIG. 1). The divide ratio generator 11 of FIG. 1 can be implemented by means of a delta sigma modulator 11A such that a PLL divider can perform fractional division.

The use of delta-sigma modulator 11A (or other dynamically changing divide ratio generator) in combination with ring counter circuit 20 and programmable counter and control circuit 22 implemented by means of static CMOS standard library cells allows the use of dynamically changing divide ratios at relatively high frequency, for example approximately 1.5 GHz.

The invention provides a way to both (1) take advantage of the benefits of using standard library logic circuit cells to implement the entire integrated circuit chip layout of clock divider 10A, and (2) work around the speed limitations of standard static CMOS library cells, to provide a high speed clock divider which provides programmability (i.e., dynamic divide ratio) and high-speed operation above roughly 500 MHz to 1 GHz.

An important advantage of clock divider 10A is the fact that no special high speed, custom designed circuitry is required. That is, only static CMOS standard cells from a conventional CMOS library are required to implement the described embodiment of the invention. Consequently, conventional digital place-and-route design tools can be utilized to implement the integrated circuit layout, resulting in lower design time and lower product cost, whereas most other circuit solutions to the above described problems of the prior art require time-consuming and costly customized circuit design and customized integrated circuit chip layout. The output clock is synchronized to the input clock. A 1.5 gigahertz input clock can be divided by any integer number between 15 and 63, thus providing a fine granularity output frequency, and the divide value can be a dynamically changing value generated by the delta-sigma modulator. Clock divider 10A can divide the input clock (e.g., the VCO clock in a PLL) at single cycle resolution, in contrast to the prior art which divides a the PLL clock with a fixed divider wherein the slower counter divides the clock in multiples of a fixed divisor. Another advantage of the described embodiment of the invention is that a low amount of jitter of the divided-down output signal CLKOUT is achieved.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

It should be appreciated that although the described clock divider divides the VCO output clock for a phase detector in a PLL, the clock divider circuit of the present invention is not limited to use in conjunction with a PLL. For example, the phase signals (actual or implicit) could be implemented using a Grey counter.

What is claimed is:

1. A frequency adjusting circuit comprising:
an asynchronous finite state machine (AFSM) configured as a counter having an input that receives an input clock signal, wherein the AFSM provides a division factor from a plurality of phase signals and phase difference between each of the phase signals relative to one another, wherein each phase signal is a divided-down representation of the input clock signal, and wherein each phase signal is phase-shifted by a predetermined amount with respect to another of the phase signals; and
programmable circuitry that generates divided down representation of the input clock signal as an output clock signal according to dynamic divide ratio information, the division factor, and the phase differences, wherein the programmable circuitry includes a down counter that receives a least a portion of the dynamic divide down ratio information and that counts down from the values of the divide ratio information in response to at least one of the phase signals produced by the AFSM.

2. The frequency adjusting circuit of claim 1, wherein the counter is configured as a ring counter circuit.

3. The frequency adjusting circuit of claim 2, wherein the counter is configured as a loadable ring counter circuit wherein information representative of a current value of the divide ratio information is loaded into the ring counter circuit in response to generation of each pulse of the output clock signal.

4. The frequency adjusting circuit of claim 2, wherein the programmable circuitry further comprises regeneration circuitry responsive to at least one of the phase signals, wherein the regeneration circuitry produces a plurality of regenerated phase signals representative of the phase signals, respectively.

5. The frequency adjusting circuit of claim 4, wherein the programmable circuitry includes a divide ratio generator that generates the divide ratio information as a plurality of MSBs and a plurality of LSBs.

6. The frequency adjusting circuit of claim 5, wherein the down counter receives the plurality of MSBs, and wherein the down counter is clocked by at least one of the regenerated phase signals to count down from a value of the MSBs to a terminal count value.

7. The frequency adjusting circuit of claim 6, wherein the programmable circuit further comprises:
control logic that receives a count signal from the down counter and at least one of the regenerated phase signals, wherein the control logic provides a plurality of control signals; and
a decoder that decodes information representative of the LSBs and the control signals to further determine the programmable amount of delay between the pulse of the input clock signal and the subsequent corresponding pulse of the output clock signal.

8. The frequency adjusting circuit of claim 7, wherein the decoder further comprises:
an OR gate;
a plurality of branches, wherein each branch corresponds to at least one of the regenerated phase signals, and wherein each branch includes:
a digital comparator that receives at least one of the control signals;
an AND gate that is coupled to the digital comparator and that receives at least one of the regenerated phase signals; and
a flip-flop that is coupled between the AND gate and to the OR gate.

9. The frequency adjusting circuit of claim 5, wherein the divide ratio generator includes a delta-sigma modulator for generating the divide ratio information.

10. The frequency adjusting circuit of claim 1, wherein a frequency of the input clock signal is greater than approximately 500 MHz to 1 GHz.

11. The frequency adjusting circuit of claim 10, wherein the asynchronous finite state machine is composed of static CMOS library logic gate cells.

12. The frequency adjusting circuit of claim 11, wherein the programmable counter circuit also is composed of static CMOS library cells.

13. The frequency adjusting circuit of claim 1, wherein the phase signals includes 4 phase signals each separated in phase from another by 90 degrees.

14. The frequency adjusting circuit of claim 1, wherein the input clock signal is the output of a voltage controlled oscillator of a phase locked loop.

15. A method for dividing a clock signal, comprising:
generating at least one phase signal which is a divided-down representation of the input clock signal and which includes information representative of a plurality phase signals, wherein each of the plurality of phase signals is a divided-down representation of the input clock signal, and wherein each of the plurality of phase signals is phase-shifted by a predetermined amount with respect to another of the plurality of phase signals; and
generating a plurality of regenerated phase signals based at least in part on the at least one phase signal;
generating a plurality of MSBs and a plurality of LSBs from dynamic divide ratio information;
partially determining a programmable amount of delay between a pulse of the input clock signal and a subsequent corresponding pulse of an output clock signal by counting down from a value of the MSBs to a terminal count value, wherein a count value is based at least in part on at least one of the regenerated phase signals;
generating a plurality control signal based part on the count value; and
decoding the control signals to generate the output clock signal.

16. The method of claim 15, wherein the step of decoding further comprises:
in each of a plurality of branches, comparing at least one of the control signals to a predetermined digital value to generate a compared value;
in each of the plurality of branches, ANDing the compared value with at least one of the regenerated phase signals to generate a logic value;
in each of the plurality of branches, storing the logic value; and
ORing the logic value from each branch.

17. An apparatus comprising:
a counter that receives a input clock signal and that generates a plurality of phase signals;
programmable circuitry having:
a phase regeneration circuit that is coupled to counter so as to receive at least one of the phase signals;
a down counter that receives at least a portion of a divide ratio signal and that is coupled to the phase regeneration circuit;
control logic that is coupled to the down counter;

a decoder that is coupled to the control logic;
phase shaping circuit that is coupled to the decoder;
output circuit that is coupled to the phase shaping circuit, wherein the output clock signal outputs an output clock signal that is an divided-down representation of the input clock signal.

18. The apparatus of claim 17, wherein the counter is a ring counter.

19. The apparatus of claim 17, wherein the control logic further comprises:
a plurality of latches, wherein each latch is coupled to the down counter; and
reset circuitry that is coupled to each latch and to the down counter.

20. The apparatus of claim 17, wherein the decoder further comprises:
an OR gate;
a plurality of branches, wherein each branch includes:
a digital comparator that is coupled to the control logic;
an AND gate that is coupled to the phase regenerating circuit and the digital comparator; and
a flip-flop that is coupled between the AND gate and the OR gate.

* * * * *